United States Patent
Kiss et al.

(10) Patent No.: US 8,305,088 B2
(45) Date of Patent: Nov. 6, 2012

(54) PROCESS AND DEVICE FOR DIFFERENTIATING OBJECTS INFLUENCING AN ELECTROMAGNETIC ALTERNATING FIELD, IN PARTICULAR METAL OBJECTS

(75) Inventors: Michael Kiss, Graz (AT); Bernhard Kohla, Graz (AT); Bernd Graze, Graz (AT)

(73) Assignee: EVK di Kerschhaggl GmbH (AT)

( * ) Notice: Subject to any disclaimer, the term of this patent is extended or adjusted under 35 U.S.C. 154(b) by 442 days.

(21) Appl. No.: 12/528,131

(22) PCT Filed: Feb. 22, 2008

(86) PCT No.: PCT/AT2008/000059
§ 371 (c)(1),
(2), (4) Date: Jan. 12, 2010

(87) PCT Pub. No.: WO2008/101270
PCT Pub. Date: Aug. 28, 2008

(65) Prior Publication Data
US 2010/0164512 A1    Jul. 1, 2010

(30) Foreign Application Priority Data
Feb. 23, 2007   (AT) ................................. A 294/2007

(51) Int. Cl.
*G01N 27/72*   (2006.01)
*G01R 27/04*   (2006.01)
*B65B 35/30*   (2006.01)
(52) U.S. Cl. ........... 324/630; 324/233; 324/633; 53/445
(58) Field of Classification Search .................. 324/228, 324/239, 232, 233, 260, 262, 263, 207.13, 324/600, 630, 633–646; 53/445, 474; 340/572.2, 340/572.1, 572.6, 547, 551; 702/127–199
See application file for complete search history.

(56) References Cited

U.S. PATENT DOCUMENTS
5,541,510 A    7/1996 Danielson
(Continued)

FOREIGN PATENT DOCUMENTS
AT           501669         10/2006
(Continued)

OTHER PUBLICATIONS

Mesina, M. B. et al., "Improvements in Separation of Non-Ferrous Scrap Metals Using an Electromagnetic Sensor", Physical Separation in Science and Engineering, Taylor & Francis, Abingdon, GB, vol. 12, No. 2, Jun. 1, 2003, pp. 87-101, XP008046807, ISBN: 1478-6478.

(Continued)

*Primary Examiner* — Melissa Koval
*Assistant Examiner* — Farhana Hoque
(74) *Attorney, Agent, or Firm* — Lowe Hauptman Ham & Berner, LLP

(57) ABSTRACT

A process for differentiating conductive and/or ferromagnetic objects (O) in a material stream (2) comprises generating an electromagnetic alternating field by exciting a coil (S) with a sinusoidal voltage ($u_e(t)$) of a constant frequency ($f_M$), detecting an impedance change in the coil, which has been caused by an object (O), by determining at least one pair of values from a peak value ($\hat{I}_M$) and a phase shift ($\Phi_m$) of the coil current ($i_M(t)$) toward the excitation potential ($u_e(t)$) of the coil, and determining the material by comparing the peak values ($\hat{I}_M$) and phase shifts ($\Phi_m$) with reference values, wherein the peak values ($\hat{I}_M$) of the coil current ($i_M(t)$) are calculated at at least one measuring phase angle ($\Phi_m$) with the aid of a window comparator having a constant window width ($\Delta i$), wherein the time ($\Delta t_M$) between the window inlet point (p4) and the window outlet point (p6) of the coil current ($i_M(t)$) is measured and the gradient of the current profile ($i_M(t)$) is calculated from the window width ($\Delta i$) and the measured time ($\Delta t_M$) and the peak value ($\hat{I}_M$) is calculated from the gradient of the sinusoidal current profile iM(t) and its frequency ($f_M$).

25 Claims, 4 Drawing Sheets

U.S. PATENT DOCUMENTS 6,768,317 B2 * 7/2004 Moller et al. ................ 324/637

FOREIGN PATENT DOCUMENTS

| | | |
|---|---|---|
| DE | 19838249 | 8/2000 |
| DE | 10003562 | 8/2001 |
| EP | 1347311 | 9/2003 |
| KR | 1020060134764 | 12/2006 |
| WO | WO 2005/043195 | 5/2005 |

OTHER PUBLICATIONS

Database Inspec [Online], The Institution of Electrical Engineers, Stevenage, GB; Sep. 2007, Cao Qingsong et al., "Theoretical and Experimental Study of Metal Type Identification Based on Eddy Current", XP002484496, Database Accession No. 9799578.

Chinese Journal of Scientific Instrument China Publication Center China, vol. 28, No. 8, Sep. 2007, pp. 1718-1722, ISSN: 0254-3087.

Dissertation by Mallwitz, R., "Analyse von Wirbelstromsignalen mit problem-angepassten Funktionen fur die zerstorungsfreie Materialprufung", University of Kassel, 2000.

Tietze, U., Schenk, Ch., "Halbleiter-Schaltungstechnki", 11th newly revised edition (1899), pp. 1058, 1212-1218.

Chinese Journal of Scientific Instrument China Publications Center, Bd. 28, NR. 9, Sep. 2007, Seiten 1718-1722.

Dissertation of Mallwitz, R., "Analyse von Wirbelstromsignalen mit problemangepassten Funktionen fur die zerstorungsfreie Materialprufung",/ "Analysis of eddy-current signals with problem-adjusted functions for a non-destructive material testing"; University of Kassel, 2000.

Tietze, U.; Schenk, Ch., "Halbleiter-Schaltungstechnik" / "Electronic Circuits", 2nd edition; pp. 976-978 and pp. 1050-1057.

* cited by examiner

PROCESS AND DEVICE FOR DIFFERENTIATING OBJECTS INFLUENCING AN ELECTROMAGNETIC ALTERNATING FIELD, IN PARTICULAR METAL OBJECTS

CROSS-REFERENCE TO RELATED APPLICATIONS

The present Application is based on International Application No. PCT/AT2008/000059, filed on Feb. 22, 2008, which in turn corresponds to Austrian Application No. A294/2007, filed on Feb. 23, 2007, and priority is hereby claimed under 35 USC §119 based on these applications. Each of these applications are hereby incorporated by reference in their entirety into the present application.

FIELD OF THE INVENTION

The invention relates to a process and a device for differentiating objects influencing an electromagnetic alternating field, in particular metal objects, using a coil arranged on a conveying route on which a material stream is moved in one direction at a predetermined speed, wherein the material stream can comprise conductive and/or ferromagnetic objects, according to the preambles of claims 1 and 12. Furthermore, the invention comprises a sorting plant for sorting objects from a material stream.

BACKGROUND OF THE INVENTION

If a temporally variable current $I_p$ flows through a coil S, an electromagnetic field $H_p$ builds up around said coil (see FIG. 1). If an electroconductive object O is located close to the coil, eddy currents $I_w$ are induced on the surface thereof and in layers near to the surface, based on the principle of electromagnetic induction. The current density thereby decreases as the depth increases. The eddy currents $I_w$ in turn result in an electromagnetic secondary field $H_s$, which is inverse to the primary field $H_p$ and thus weakens it. This effect is also referred to as the eddy current effect and is illustrated in FIG. 1. As a result of the eddy current effect, the inductance $L_s$ of the coil S loaded with sinusoidal current $I_p$ decreases if the conductive object O is brought near the coil S. At the same time, the resistive component $R_S$ of the coil S increases. Thereby, $L_S$ and $R_S$ are the series-connected components of an equivalent electric circuit diagram for describing the coil impedance $Z_S$ of the coil S. The following applies: $Z_S = R_S + j\omega \cdot L_S$. However, if the electroconductive object O is made up of ferromagnetic materials, a magnetization of the object O occurs in addition to the eddy current effect. As a result, a further magnetic field $H_m$ not to be ignored is formed (see FIG. 1) which is aligned with the primary field $H_p$ and thus amplifies it. Said effect is referred to as the ferromagnetic effect and interferes with the eddy current effect. The ferromagnetic effect is normally more pronounced than the eddy current effect, and this tends to result in an increase in the inductance $L_S$ as well as an increase in the ohmic resistance $R_S$ in the above-described equivalent circuit diagram of the coil S.

In the dissertation by Mallwitz R., "Analyse von Wirbelstromsignalen mit problem-angepassten Funktionen fër die zerstörungsfreie Materialprüfung", University of Kassel, 2000, the prior art regarding the determination of material properties by means of the eddy current effect and the ferromagnetic effect is explained. According to this, eddy currents depend, on the one hand, on object properties such as the conductivity $\sigma$ and the relative magnetic permeability $\mu_r$ and hence on physical material properties, but also on the surface condition and homogeneity in the eddy current range such as the size and shape of the object and, on the other hand, also on the excitation (magnetic primary field strength $H_p$ and frequency) and the distance between objects.

Usually, eddy currents are induced in conductive materials by excitation coils, whereby the primary field is influenced by the resulting magnetic field. This influence leads, on the one hand, to a change in the impedance of the excitation coil, which can be measured (parametric principle), on the other hand, however, the induced voltage in an additional secondary coil changes, too (transformational principle). The excitation of the excitation coil with sinusoidal current is most common (single frequency method). In doing so, the coil is normally a component of an oscillating circuit, in most cases of a serial oscillating circuit. The current and voltages within the circuit change if a conductive object enters the effective range of the coil field.

Irrespective of the principle, the measurands can be measured either absolutely (absolute arrangement) or as differential signals to a reference sensor (differential arrangement).

The excitation of the magnetizing coil can also occur with pulsed currents (pulse induction method).

From the European patent application EP 1 347 311 A2, a process for sorting out metal objects of a particular material property, in particular nonferrous metals between themselves, using several pulse induction single probes which form the detector and pick up induction signals of the metal objects, is known, whereby changes in the induction signals emitted by the metal objects are evaluated for sorting out.

From DE 198 38 249 A1, a sorting plant for sorting metallic particles is known, by means of which it ought to be possible to determine which materials possess metal particles. Said plant consists of a detector comprising single probes in an array arrangement with a high spatial resolution. The particles pass through a magnetic alternating field in a frequency range from 0.1 MHz to 1.0 MHz. Eddy currents which reduce the magnetic field develop in the metallic particles. Those changes in the magnetic field are detected by magneto-resistive sensors and transformed into electronic signals which are analyzed. In practice, however, the sensitivity of this detector and the signal progression produced for this purpose are not sufficient for reliably sorting out, e.g., nonferrous metals between themselves. In addition, said detector is relatively expensive.

A device and a process by means of which it is possible to sort out metals of different colours, i.e., nonferrous metals, between themselves is indicated and described in DE 100 03 562 A1. A differentiation between the nonferrous metals becomes possible only by an optical sensor which is designed as a camera, whereby metal fragments have to be illuminated. Different air nozzles which are able to sort a bulk material stream in free fall are provided for sorting out. A second detector designed as a metal detector is actually also arranged, but said detector is unable to distinguish between different nonferrous metals. The metal detector is only able to distinguish between ferrous metals and nonferrous metals. In practice, it is therefore usable only in combination with the optical sensor. The optical sensor differentiates metals only according to their appearance, but not according to their electromagnetic properties.

Processes are also known in which an evaporation of materials to be separated is effected with a laser or a radioactive irradiation of those materials is performed. However, those processes are relatively expensive.

Furthermore, it is known and common to use so-called magnetic separators for presorting ferromagnetic materials from other composite materials, with a subsequent separation of all remaining metals by means of an eddy current separator.

The signal evaluation with single frequency methods is usually carried out by evaluating the peak value ("amplitude") and/or the phase shift ("phase") of the sinusoidal coil current toward the excitation potential of the coil, which excitation potential is also sinusoidal. Rectifier circuits with a subsequent maximum value storage, scanning-holding elements or synchronous rectifiers are generally used for the "amplitude measurement". Phase-sensitive rectifiers (synchronous rectifiers) are routinely used for measuring the phase shift (see Austrian Patent AT 501669 or Tietze, U., Schenk, Ch.: "Halbleiter-Schaltungstechnik", 11$^{th}$ newly revised edition (1899), p. 1058, 1212-1218).

In practice, however, the reliable acquisition of information from eddy current data which have been measured still is a problem of the material selective eddy current measuring technique. The reasons for this are to be found in the complexity of the underlying physical phenomena. Therefore, apart from few special cases, the signal forming process is currently not describable in a universally valid form and the mathematical inversion of this illustration is not possible (see Mallwitz, R. l.c.).

SUMMARY OF THE INVENTION

The present invention is thus based on the problem of providing a process and a device for differentiating objects influencing an electromagnetic alternating field, in particular metal objects, which allow a quick and precise distinction between the above-mentioned objects in a material stream, which involves a small expenditure of hardware. Furthermore, influences of the size, thickness and shape of the objects to be differentiated on the differentiation process are to be minimized. The device is supposed to be simple, sturdy and fail-safe and to allow the recovery of amplitude and phase signals in an extremely efficient manner with an analog-to-digital conversion taking place at the same time so that advantages with regard to rapidness, costs and simple construction will ensue in comparison with the otherwise customary arrangements comprising a synchronous rectifier, phase discriminator and low-pass filter, as described, e.g., in AT 501669.

The present invention solves the problem posed by means of a process for differentiating objects influencing an electromagnetic alternating field having the features of claim 1 as well as by means of a device for differentiating objects influencing an electromagnetic alternating field having the features of claim 12. Advantageous embodiments of the invention result from the subclaims. Furthermore, the invention comprises a sorting plant with at least one device according to the invention for differentiating objects influencing an electromagnetic alternating field.

If the comparator window, i.e., the values of the inlet point and the outlet point of the window of the window comparator, are arranged symmetrically to a signal centre line, in particular zero line, of the coil current, linear ratios for calculating the gradient are obtained in said range, which simplify the calculation.

In order to eliminate morphological artefacts as much as possible, at least one peak value determined in a discrete measuring phase is preferably compared to corresponding peak values of reference samples for determining the material of the object.

In order to achieve a high sensitivity of the measurements, it is advantageous if at least one measuring phase near a maximum angle of phase difference, which occurs when the object comes closest to the coil, is selected, wherein, however, the distance between the measuring phase angle and the maximum angle of phase difference is preferably chosen to be at least so large that it is achieved also with the smallest objects occurring in the material stream.

A further advantage of the invention is that the moment of achieving the measuring phase angle with a known speed of the material stream can be used as a reference moment for discharging the object from the material stream.

It is intended to determine the maximum angle of phase difference in order to obtain a measure for the size of the object. In doing so, the moment of achieving the maximum angle of phase difference with a known speed of the material stream can be used as a reference moment for discharging the object from the material stream.

For an even more precise evaluation of the material of objects, by periodically detecting pairs of values from the peak value and phase shift of the current profiles, the respective locus curve is received point by point for different phase angles and used for evaluation via comparison with reference locus curves.

Furthermore, a standardization can be provided by, first of all, determining the offset phase from the excitation potential distribution and the current profile of the coil in a condition which is unaffected by objects and subsequently relating the measuring phase angles of the current profiles to the offset phase.

It has become apparent that the invention operates excellently at an excitation or measuring frequency $f_M$, respectively, ranging between 1 kHz and 1 MHz, preferably between 5 and 100 kHz and most preferably between 10 and 50 kHz.

In order to minimize influences of the size and shape of the object, the coil diameter should be chosen to be smaller than an average diameter of the objects to be differentiated.

Further advantages of the invention become evident from the subsequent detailed description of exemplary embodiments of the invention, with the invention not being restricted to those embodiments, however.

BRIEF DESCRIPTION OF THE DRAWINGS

The invention is now illustrated in further detail on the basis of an exemplary embodiment not limiting the scope of the invention, with reference to the drawings. In the drawings.

DETAILED DESCRIPTION OF THE INVENTION

The present invention is based on a single-coil process operating according to the initially mentioned parametric principle. Thereby, the fact is utilized that, if a coil S is excited by a sinusoidal excitation potential of a constant frequency or, respectively, a sinusoidal current $I_p$ passes through it, the electromagnetic field $H_p$ built up around the coil starts to interact with an electroconductive and/or ferromagnetic object O near the coil S due to the eddy current effect and the ferromagnetic effect, respectively. Said interaction leads to a change in the inductance $L_s$ and resistive component $R_S$ of the coil S, i.e., all in all, to a change in the coil impedance $Z_S = R_S + j\Omega \cdot L_S$ of the coil S.

As can be seen from the block diagram of FIG. 4, which shows an embodiment of the device according to the invention for differentiating objects influencing an electromagnetic alternating field, which will be described in detail further below, the excitation coil S is connected with a capacitor C into an oscillating circuit, namely in this example by a series connection of the excitation coil S and the capacitor C into a serial oscillating circuit. Said oscillating circuit is loaded with a sinusoidal alternating voltage $u_e(t)$ of a constant amplitude and frequency, preferably its natural frequency, so that a current $i_0(t)$ flows through the coil S and hence through the serial oscillating circuit, which current is phase shifted by an offset phase angle $\phi_{os}$ relative to the excitation potential.

If an electroconductive and/or ferromagnetic object enters the range of influence of the electromagnetic field generated by the coil S, the change in the coil impedance, which depends on the material of the object, results in a change in the amplitude of the current with a concurrent phase shift, which can be evaluated with the aid of the complex alternating current calculation. If the object O moves past the coil S in such a way that the central point of the object (centre of gravity) is guided linearly (direction x, see FIG. 6) across the central point of the coil (coil axis SA) at a predetermined distance z from the coil S—measured in the direction of the coil axis SA—(i.e., past the coil S above or underneath it), the result is a material characteristic progression of the changes in the amount and phase of the coil current depending on the x-position of the object O relative to the coil S.

Figure 1:
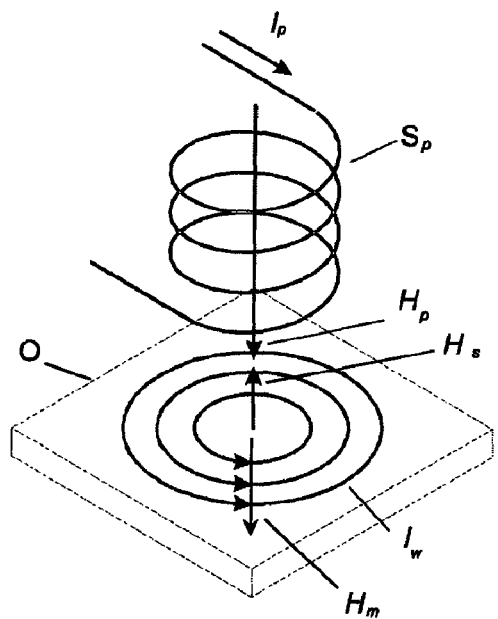
FIG. 1 shows the principle of the effects of an eddy current effect and a ferromagnetic effect in an electromagnetic alternating field produced by a coil.
Figure 2:
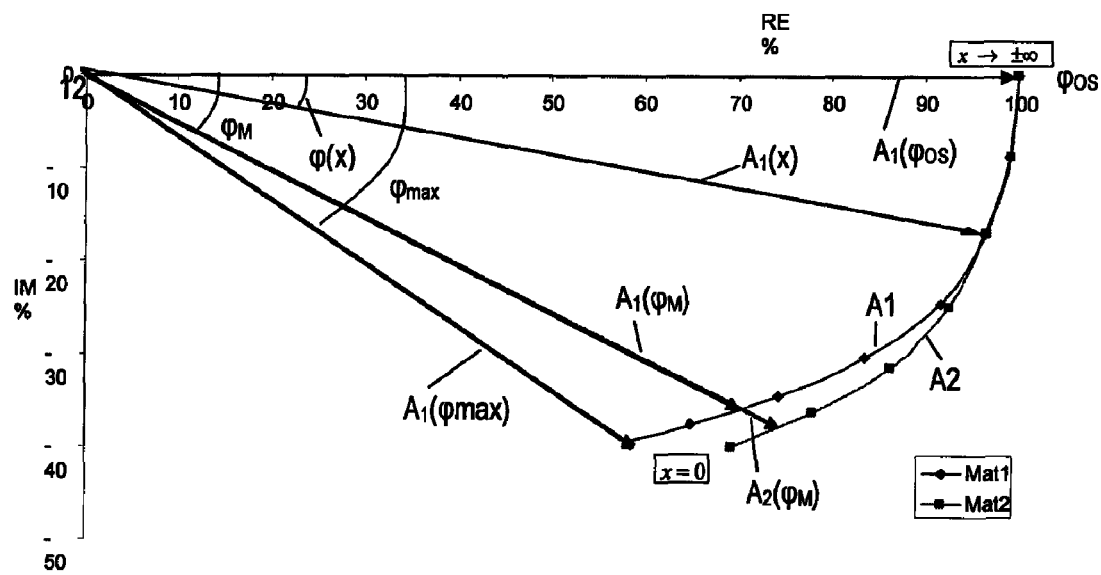
FIG. 2 shows locus curves and selected phasor diagrams from which the changes in impedance result which have been caused in a coil by an electroconductive and/or ferromagnetic object.

If, for the object O along its journey in the x-direction, all pairs of values of the amount (amplitude and/or peak value) $A1(x)$ and phase $\phi(x)$ for the path from $x \to -\infty$ via $x=0$ to $x \to +\infty$ are plotted as phasor diagrams into the complex number plane, a locus curve A1 with the object position x is obtained as an argument. FIG. 2 shows the above-mentioned local curve A1 as well as a second local curve A2 for a second object in the complex number plane, with the second object consisting of a material Mat2 which differs in its electrical conductivity and its ferromagnetic properties, respectively, from a material Mat1 from which the first object O is formed, for which the first local curve A1 has been received.

For the sake of better clarity, in the diagram of FIG. 2, the offset phase $\phi_{os}$ of the uncovered coil S, i.e., if no object O is located in the range of influence of the coil S or, in other words, if $x \to +\infty$, has been determined to be $\phi_{os}=0$, and the amount $A(\phi_{os})$ of the coil current $i_0(t)$ thus determined has been standardized to 100%.

From FIG. 2 it is evident that, if the object O moves toward the coil S from a great distance ($x \to -\infty$), the tip of the position vector $A1(x)$ migrates along the locus curve A1 beginning from a starting point $A1(\phi_{os})$ and reaches the reversal point $A1(\phi_{max})$ at a maximum phase shift $\phi_{max}$ when the object O reaches the central point of the coil (x=0). It should be mentioned that the phase shift $\phi(x)$ is positive if the ferromagnetic effect is predominant ($\mu_r \gg 1$, iron etc.), and is negative if the eddy current effect is predominant ($\mu_r \approx 1$, nonferrous metals etc.). If $\mu_r > 1$ (e.g. 10, stainless steels etc.), both positive and negative values may occur for $\phi(x)$.

If the object O moves beyond the central point of the coil (x=0), i.e., moves away from the coil S, the position vector $A1(x)$ moves back from the reversal point $A1(\phi_{max})$ of the locus curve A1 in order to, ideally, reach the starting point $A1(\phi_{os})$ of the locus curve A1 again, with a large distance between the objects ($x \to +\infty$). Of course, the same applies analogously to the second locus curve A2.

In order to eliminate morphological artefacts as much as possible, it is intended according to the invention to perform amount measurements of the currents in an interpolating manner with discrete phases (measuring phases $\phi_M$) and to compare them to corresponding amounts of reference samples.

Figure 6:
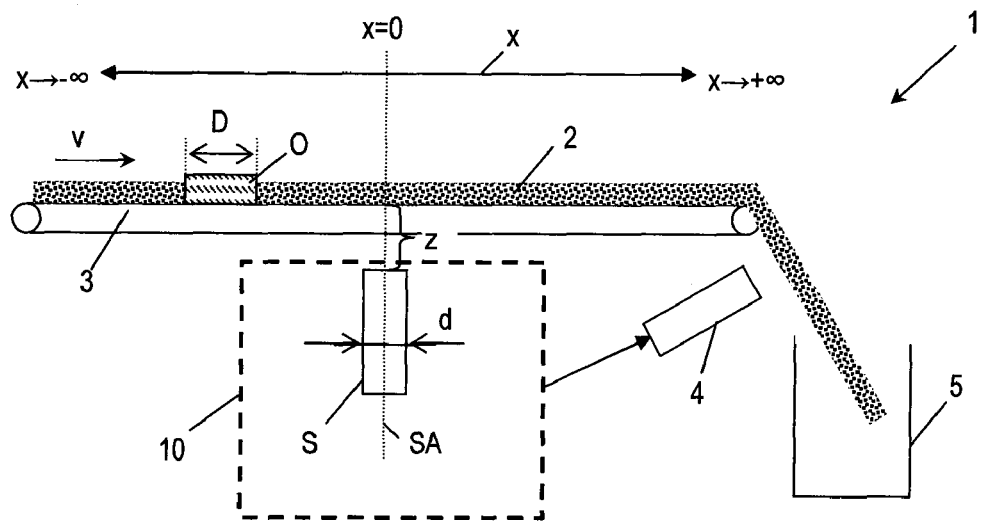
FIG. 6 shows a schematic illustration of a sorting plant according to the invention.

For the purpose of high sensitivity, the measuring phases $\phi_M$ should be located close to point x=0 the instant of which can, in addition, be used as a simple reference for the discharge of objects from the material stream 2 in a sorting plant 1, if the speed v of the material stream 2 is known (see FIG. 6).

In a further embodiment of the invention, it is intended to determine the maximum angle of phase difference $\phi_{max}$ which occurs when the object is located at point x=0. The moment of the occurrence of said maximum angle of phase difference $\phi_{max}$ can also be used as a reference for the discharge of objects from the material stream 2 in the sorting plant 1, since the speed v of the material stream 2 is known.

For a respective predetermined measuring phase angle $\phi_M$, the amplitudes $A1(\phi_M)$ and $A2(\phi_M)$, respectively, are indicators for the material Mat1 or Mat2, respectively, of the respective object O. The difference between the amplitudes $A1(\phi_M)$ and $A2(\phi_M)$ and hence the sensitivity of the measurement are the greater, the closer to the maximum angle of phase difference $\phi_{max}$ the measuring phase angle $\phi_M$ is chosen to be located. Since, however, the maximum angle of phase difference $\phi_{max}$ depends, among other things, on the size of the object O, the measuring phase angle $\phi_M$ must not be chosen to be too large in practice, since otherwise it might possibly not be achieved with small objects O. With large objects, in turn, the predetermined measuring phase angle $\phi_M$ is possibly achieved already with a partial covering of the coil S by the object O, i.e., if $|x|>0$. However, this is no disadvantage for the discernability of the object O.

The shapes of the locus curves A1, A2 depend, among other things, on the following influencing variables:
Coil influencing variables:
  measuring frequency $f_M$ (=frequency of the excitation potential and/or the current through the coil),
  primary field strength $H_p$,
  coil diameter and shape, number of turns in the coil,
  structural axial distance between coil and object
Material specific physical object influencing variables (=measurands):
  relative magnetic permeability $\mu_r$ (responsible for the generation of the secondary field amplifying the primary field)
  electrical conductivity $\sigma$ (responsible for the eddy current effect)
Morphological object influencing variable:
  size, thickness, shape, surface condition, homogeneity in the eddy current range, volume
Disturbance variables:
  variation in the distance between objects, interference fields, noise, object movement, temperature, non-linearities, . . . .

According to the invention, the following measures are suggested in order to utilize the above-mentioned influencing variables for the measurements according to the invention:

The measuring frequency $f_M$ is kept constant, wherein a value between 1 kHz and 1 MHz, preferably between 5 and 100 kHz and most preferably between 10 and 50 kHz, has stood the test. The optimization of the frequency leads to the fact that the penetration depth to be expected, on the one hand, minimizes the influences of the surface condition for the materials to be selected as much as possible, while, on the other hand, however, sufficiently thin objects are safely identified (the influence of thickness is minimized).

The primary field strength $H_p$ should be constant and as large as possible.

The coil diameter d is optimized such that the required axial object distance z from the coil is achieved, but influences of the size and shape of the object are minimized. In order to achieve this, it is suggested that a coil diameter smaller than an average diameter of the objects to be differentiated be chosen, whereas, however, it must be considered that the sensitivity of the coil decreases with a smaller coil diameter.

The coil shape is optimized empirically with support by the Finite Element Method (FEM).

Structurally, the axial object distance from the coil is kept as constant as possible.

Morphological object influencing variables, in particular influences of the size, thickness, volume and shape of the objects, can be minimized by the measuring method according to the invention described below, influences of the surface condition of the objects are minimized for a wide object spectrum by structural measures (coil shape).

At present, the influences of the homogeneity in the eddy current range are still uncontrollable, but negligible for the practical application of the invention.

With regard to disturbance variables, the device according to the invention has turned out to be very interference resistant.

Figure 3:
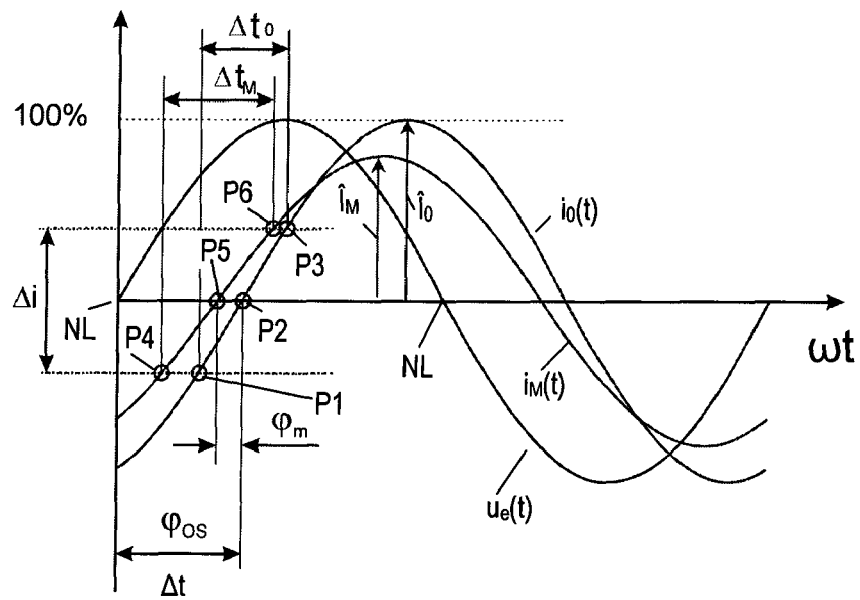
FIG. 3 shows voltage and current diagrams for illustrating the signal evaluation process according to the invention.

The signal evaluation process according to the invention is now described on the basis of the voltage and current diagrams of FIG. 3. This is subsequently followed by a description of an implementation of said process in a device according to the invention for differentiating objects influencing an electromagnetic alternating field.

The signal evaluation is based on an extremely efficient method in which the locus curve is determined point by point. In the most simple case, only one point of the locus curve needs to be determined and evaluated by specifying a discrete measuring phase $\phi_M$ and calculating the amount (amplitude) $\hat{I}_M$ of the current $i_M(t)$ in an interpolating manner upon reaching said measuring phase $\phi_M$. The material of the object O can be inferred from the pair of values, measuring phase $\phi_M$ and amount $\hat{I}_M$, via comparison with reference values.

In the evaluation process according to the invention, the excitation frequency $f_M$ of the magnetizing coil S dictates the sampling frequency (one measurement per period), as determined by the system. The excitation frequency $f_M$ is thereby kept constant.

At first, the zero crossing p2 of the current $i_0(t)$ and hence the offset phase $\phi_{os}$ of the serial oscillating circuit are calculated from the excitation potential distribution $u_e(t)$ and the current profile $i_0(t)$ of the uncovered coil S or the uncovered serial oscillating circuit, respectively. The zero crossings of the excitation potential $u_e(t)$ are indicated by reference character NL. For further considerations, said offset phase $\phi_{os}$ may be assumed to be 0°. If an object O now enters the range of influence of the coil S, the phase $\phi(x)$ changes depending on the x-position of the object O and hence also the current profile changes. If the phase $\phi(x)$ deviates from the offset phase $\phi_{os}$ by a predetermined measuring phase angle $\phi_M$, the current profile $i_M(t)$ illustrated in FIG. 3 adjusts itself. The determination of the measuring phase angle $\phi_M$ is performed by measuring the zero crossing p5 of the current profile $i_M(t)$ with the aid of a zero crossing detector (a current or voltage comparator, respectively) and a digital counter with a constant counting frequency. Since the excitation frequency (measuring frequency) $f_M$ is known, the measuring phase angle $\phi_M$ can be calculated from the time between the two zero crossings p2 and p5, respectively.

The amounts (in the present specification also referred to as amplitudes and peak values, respectively) of the current profiles $i_0(t)$ and $i_M(t)$, respectively, are calculated with the aid of a window comparator symmetrical to a signal centre line (here to the zero line) and having a constant window width $\Delta i$ by measuring the gradients of the sinusoidal current profiles $i_0(t)$ and $i_M(t)$, respectively, which have a known frequency and have been linearized in the zero crossing. More precisely, the inlet point p1 into the comparator window and the outlet point p3 therefrom are measured for the current profile $i_0(t)$ by means of the window comparator and the time $\Delta t_0$ between the window inlet point p1 and the window outlet point p3 is detected by means of a timer, which is implemented, e.g., as a digital counter of a constant counting frequency. Due to the linear progression of the sinusoidal current profile $i_0(t)$ between points p1 and p3, the gradient of the current profile $i_0(t)$ in the zero crossing p2 can be calculated from the window width $\Delta i$ of the window comparator and the time $\Delta t_0$. The same applies analogously to the current profile $i_M(t)$ for which a window inlet point p4 and a window outlet point p6 result, wherein the time elapsed between the occurrence of the points p4 and p6 is determined to be $\Delta t_M$ by the timer.

By definition, the gradients and phase shifts are sufficient for a linear equation. A respective pair of values, amplitude and phase shift of the current profiles $i0(t)$ and $i_M(t)$, can thus be calculated easily from the pairs of counts obtained, whereby the associated locus curve A1 is generated point by point by periodically detecting those pairs of values for different phase angles $\phi(x)$.

The peak value $\hat{I}$ can be calculated for sinusoidal currents by $$\hat{I} = \frac{1}{2 \cdot \pi \cdot f} \cdot \frac{di}{dt}$$

in the current zero crossing.

Since the frequency of the sinusoidal excitation potential $u_e(t)$ and hence also the frequency $f_M$ of the evaluated coil current $i_0(t)$ or $i_M(t)$, respectively, is constant (linear system), a direct correlation between the peak values $\hat{I}_0$ and $\hat{I}_M$, respectively, of the coil currents $i_0(t)$ and $i_M(t)$, respectively, and the amount of the gradient $\Delta i/\Delta t_0$ or $\Delta i/\Delta t_M$, respectively, of the tangent arises in the zero crossing. For $\Delta i \ll \hat{I}$, in the above formula, the differential quotient $di/dt$ can be replaced by the difference quotient $$\frac{\Delta i}{\Delta t}$$

so that the formula for the peak values $\hat{I}_0$ and $\hat{I}_M$, respectively, reads as follows:

$$\hat{I}_0 = \frac{1}{2 \cdot \pi \cdot f_M} \cdot \frac{\Delta i}{\Delta t_0}$$

or $$\hat{I}_M = \frac{1}{2 \cdot \pi \cdot f_M} \cdot \frac{\Delta i}{\Delta t_M}$$

In the diagram of FIG. 3, the peak value $\hat{I}_0$ has been standardized to 100% and thus corresponds to the amplitude of the position vector $A1(\phi_{os})$ in the locus curve diagram of FIG. 2.

For the phase shift $\phi_{os}$ between the excitation potential $u_e(t)$ and the coil current $i_0(t)$ in °, the following applies:

$$\phi_{os} = 360 \cdot f_M \cdot \Delta t.$$

Naturally, with a constant frequency, a direct correlation between the phase shift and the measured time arises also in this case.

For simple material differentiation tasks, the evaluation can be further simplified by using the window inlet points p1, p4 or the window outlet points p3, p6 instead of the current zero crossings p2, p5 for the phase measurement and by dispensing with the approximation (window current $\Delta i <<$ peak value of the current amplitude $\hat{I}$) and by evaluating the counts of the digital counter directly (without conversion into amplitude and phase values, respectively). A small error in measurement does indeed occur in this evaluation, but since said error is constant, it may be factored into the evaluation.

However, for challenging material differentiation tasks, methods of signal processing for evaluating the entire locus curve may also be used.

Via comparison with locus curves of reference objects, the type of metal (electrical conductivity, relative magnetic permeability) can be determined very reliably for objects of various shapes, sizes and thicknesses in a wide range.

Figure 4:
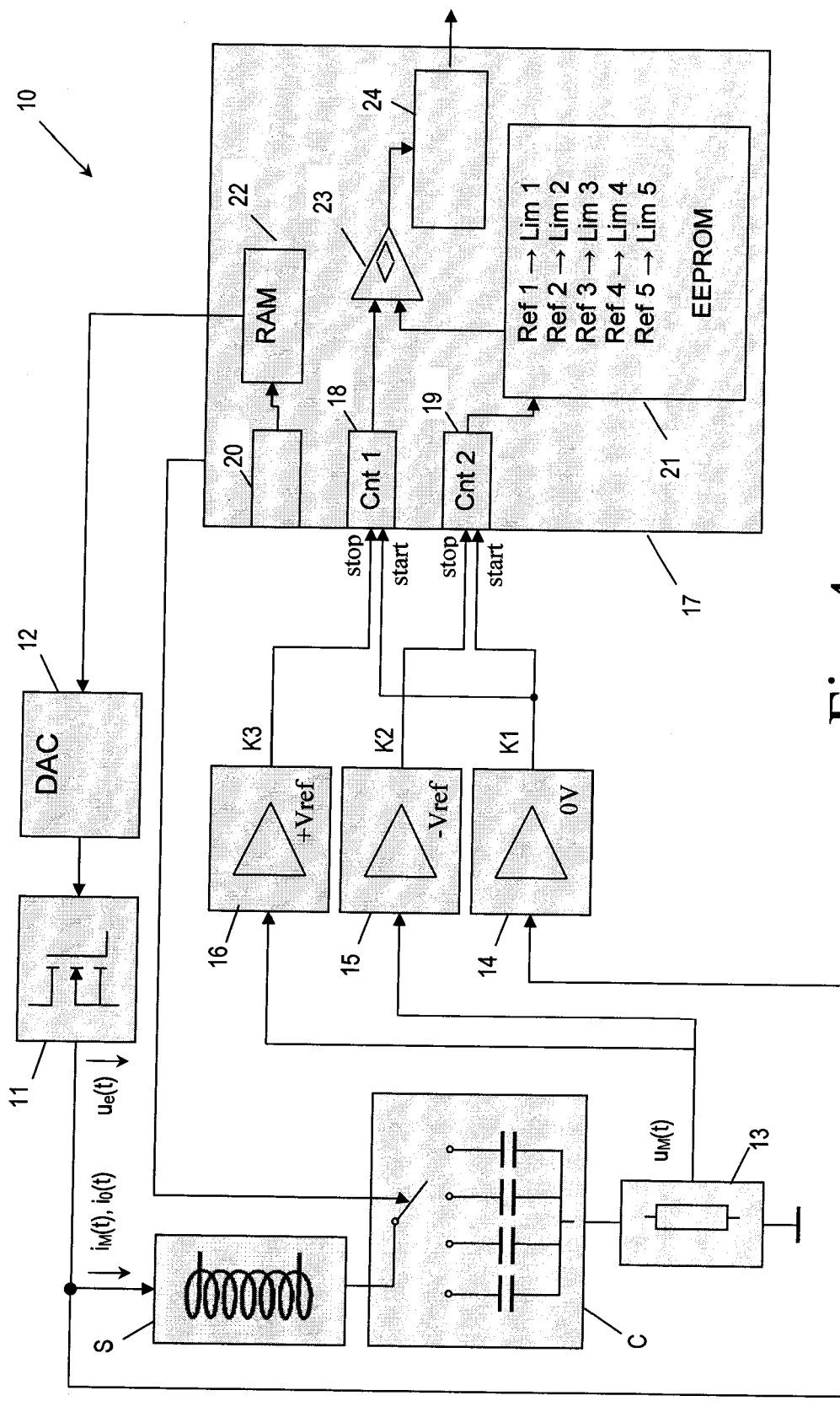
FIG. 4 shows a schematic block diagram of an embodiment of a device according to the invention for differentiating objects influencing an electromagnetic alternating field.

FIG. 4 shows a block diagram of a device 10 according to the invention for differentiating objects influencing an electromagnetic alternating field, in which the differentiation method according to the invention is implemented with some simplifications. In the device 10 according to the invention, an excitation coil S is serially connected with a switchable capacitance C into a serial oscillating circuit. The serial oscillating circuit is loaded with a sinusoidal alternating voltage $u_e(t)$ of a constant amplitude and frequency, preferably its natural frequency, by a FET 11 controlled by a DAC 12 so that a sinusoidal current $i_0(t)$ flows through the coil S and hence through the serial oscillating circuit, which current is phase shifted by an offset phase angle $\phi_{os}$ relative to the excitation potential $u_e(t)$. The capacitance C is configured to be switchable in order to be able to adjust the offset phase angle $\phi_{os}$ empirically. The frequency $f_M$ of the excitation potential $u_e(t)$ was determined to be 13 kHz. As an alternative to the DAC 12 and FET 11, a sine wave generator comprising an amplifier might also be used.

Figure 5:
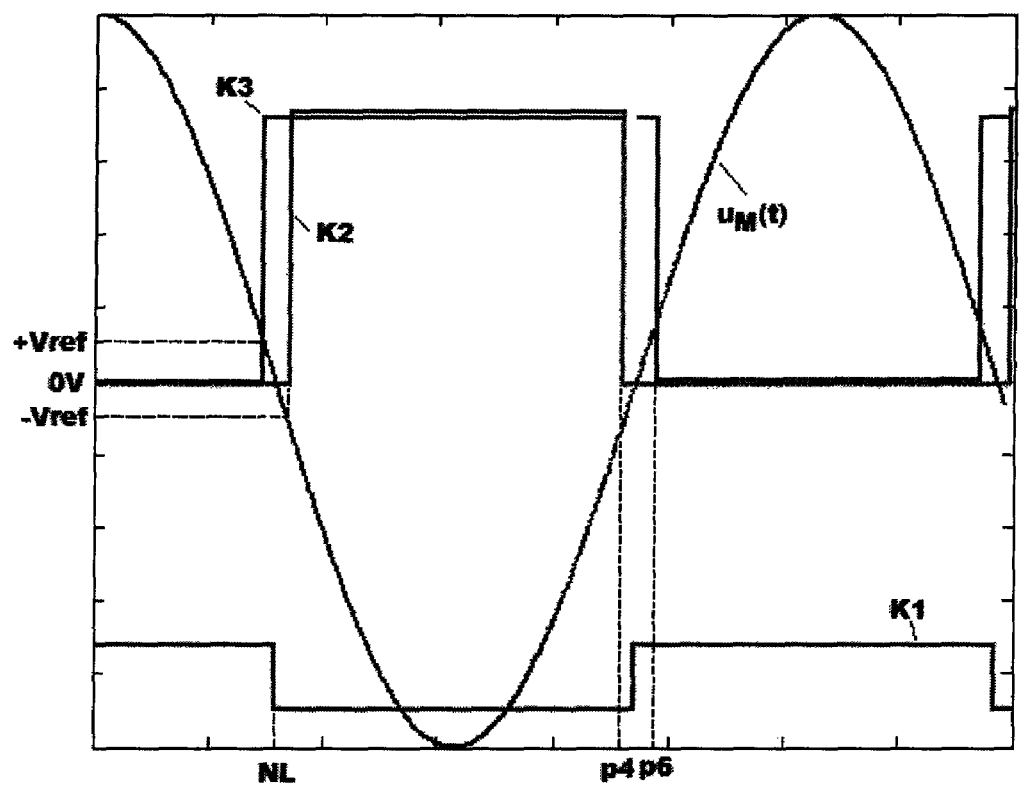
FIG. 5 shows a signal diagram of the output signals of the comparators used in the device of FIG. 4.

If an electroconductive and/or ferromagnetic object (not illustrated) is moved past the coil S, the inductance of the coil S and hence also the phase angle between the excitation potential $u_e(t)$ and the current profile through the coil will change. For example, the current profile $i_M(t)$ occurs at a defined measuring phase angle $\phi_M$. By means of a shunt resistor 13, the current through the serial oscillating circuit is converted into a voltage signal $u_M(t)$ which is supplied to the inputs of two comparators 15, 16 whose reference voltages are determined to be −Vref and +Vref. The comparators 15 and 16 form a window comparator whose window width defined from the difference between the reference voltages +Vref and −Vref corresponds to the window width $\Delta i$ of the signal diagram of FIG. 3. A further comparator 14 is supplied with the excitation potential $u_e(t)$, its reference voltage is determined to be 0V so that it covers the zero crossing NL of the excitation potential $u_e(t)$. The output signal K1 of the comparator 14 depending on the excitation potential $u_e(t)$ is illustrated in the signal diagram of FIG. 5. Furthermore, the reference voltages −Vref and +Vref of the two comparators 15, 16 as well as the output signal K2 of the comparator 15 and the output signal K3 of the comparator 16 are illustrated in the signal diagram of FIG. 5.

The comparator 14 starts a first counter 18 and a second counter 19 at the zero crossing NL of the excitation potential $U_e(t)$. Both counters 18, 19 are negatively flank-triggered. The comparator 15 stops the second counter 19 at the instant p4 when the input signal $u_M(t)$ exceeds its reference voltage value −Vref, i.e., enters into the comparator window. The comparator 16 stops the first counter 18 at the instant p6 when the input signal exceeds its reference voltage value +Vref, i.e., leaves the comparator window. The two counters 18, 19 are designed as digital counters with a constant counting frequency so that the time difference $\Delta t_M$ can be derived from the difference between the two counts, in this connection, confer FIG. 3. In the present exemplary embodiment, the two counters 18, 19 are integrated in a microcontroller 17. The gradient of the signal $u_M(t)$ in the zero crossing p5 (see FIG. 3) can be determined from the time difference $\Delta t_M$ and the known frequency of the signal $u_M(t)$ and the amplitude of the signal $u_M(t)$ can be calculated from the gradient, as has been described above on the basis of the formulae. In a variant of the present embodiment of the device according to the invention, the comparator 15 could start a counter (18 or 19) and the comparator 16 could stop the counter. From the count, the length of time $\Delta t_M$ is directly derivable which the coil current $i_M(t)$ needs in order to pass through the comparator window $\Delta i$, from which, in turn, the peak value can be calculated.

In the present exemplary embodiment, however, some simplifications have been made for signal evaluation: For example, the phase between the signals $u_e(t)$ and $u_M(t)$ is derived with a small, but constant error from the difference between the instants NL and p4. Furthermore, the amplitude of the signal $u_M(t)$ is not calculated directly from the above-indicated formulae, but the counted measurand of the second counter 19 is used as an index of a reference value table which is stored in an EEPROM 21 and, for each index value Ref__1-Ref__5, possesses a reference threshold value Lim__1-Lim__5 associated therewith, with which the counted measurand of the first counter 18 is compared in a digital comparator 23. A classification and object-length determination unit 24 infers the material of the object from exceeding or falling below the reference threshold value Lim__1-Lim__5 used in each case. In this embodiment of the device 10 according to the invention, the counts of the first and second counters 18, 19 are thus evaluated directly, i.e., without previous conversion into amplitude and phase values, respectively. By providing the reference value table, the fact is taken into account that different optimum points for measuring exist for different decisions regarding materials (VA-NE, Al—Cu, . . . ). Since each object approaches the coil, a new count in the second counter 19 and hence a new reference and limiting value exist in each sample period.

The microcontroller 17 furthermore comprises a timer 20 and a RAM 22, wherein the metered measurands of the timer 20 control the reading of associated tabular values from the RAM 22 into the DAC, which values provide for the generation of the sinusoidal voltage $u_e(t)$.

In FIG. 6, a sorting plant 1 according to the invention is illustrated schematically. It comprises a conveyor belt 3 on which a material stream 2 moves at a constant speed v in which objects O are contained which are supposed to be identified and sorted out based on their conductivity and/or ferromagnetic properties. For this purpose, a device 10 according to the invention for differentiating the objects O is arranged below the conveyor belt 3. The coil S of an oscillating circuit of the device 10 is arranged such that its coil axis SA is at right angles to the conveying direction (x-direction) of the material stream 2. Furthermore, the coil S is at a distance z from the material stream 2—measured in the direction of the coil axis SA. The diameter d of the coil S is dimensioned such that it is smaller than an average diameter D of the objects O to be differentiated. If the objects O move in the x-direction across the central point of the coil (coil axis SA), a material characteristic progression of the changes in the amount and phase of the coil current depending on the x-position of the object O relative to the coil S sets in, which is evaluated in the device 10. Depending on the result of the evaluation, the device 10 activates an object discharging unit 4, for example, an air nozzle, which discharges the objects O from the material stream 2. In the illustrated exemplary embodiment, the sorted material stream 2 reaches a container 5. Of course, in practice, a plurality of coils are arranged across the width of the conveyor belt 3, with the intervals between coils being chosen such that no object O can pass between the coverages of the coils without being noticed. Instead of a conveyor belt 3, for example, a slide may also be provided.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A process for differentiating objects influencing an electromagnetic alternating field having metal objects, using a coil arranged on a conveying route on which a material stream is moved in one direction at a predetermined speed, wherein the material stream comprises conductive and/or ferromagnetic objects, comprising the steps of:
generating an electromagnetic alternating field by exciting the coil with a sinusoidal voltage of a constant frequency,
detecting an impedance change in the coil, which has been caused by an object, by determining at least one pair of values from a peak value of a sinusoidal coil current and a phase shift between the coil current and an excitation voltage and determining the material of the object by comparing the at least one pair of values from a peak value and a phase shift of the sinusoidal coil current with reference values,
wherein the peak values of the sinusoidal coil current are calculated at at least one predetermined measuring phase angle with the aid of a window comparator having a constant, adjustable, window width, wherein the time between the window inlet point and the window outlet point of the coil current is measured and the gradient of the current profile is calculated from the window width of the window comparator and the measured time and the peak value is calculated from the gradient of the sinusoidal current profile and its known frequency.

2. The process according to claim 1, wherein the values of the inlet point and the outlet point of the window of the window comparator are arranged symmetrically to a signal centre line, in particular zero line, of the coil current.

3. The process according to claim 1, wherein at least one peak value determined in a discrete measuring phase is compared to corresponding peak values of reference samples for determining the material of the object.

4. The process according to claim 1, wherein at least one measuring phase near a maximum angle of phase difference, which occurs when the object comes closest to the coil, is selected, wherein, the distance between the measuring phase angle and the maximum angle of phase difference is chosen to be at least so large that it is achieved also with small objects occurring in the material stream.

5. The process according to claim 1, wherein the moment of achieving the measuring phase angle with a known speed of the material stream is used as a reference moment for discharging the object from the material stream.

6. The process according to claim 1, wherein the maximum angle of phase difference is determined.

7. The process according to claim 1, wherein the moment of achieving the maximum angle of phase difference with a known speed of the material stream is used as a reference moment for discharging the object from the material stream.

8. The process according to claim 1, wherein by periodically detecting pairs of values from the peak value and phase shift of the current profiles, the respective locus curve is received point by point for different phase angles and used for evaluation via comparison with reference locus curves.

9. The process according to claim 1, wherein an offset phase is determined from the excitation voltage distribution and the current profile of the coil in a condition which is unaffected by objects and subsequently the measuring phase angles of the current profiles are related to the offset phase.

10. The process according to claim 1, wherein the excitation or measuring frequency, respectively, is adjusted to a value ranging between 1 kHz and 1 MHz, between 5 and 100 kHz and between 10 and 50 kHz.

11. The process according to claim 1, wherein the coil diameter is chosen to be smaller than an average diameter of the objects to be differentiated.

12. A device for differentiating objects influencing an electromagnetic alternating field, comprising:
a voltage source for generating a sinusoidal excitation potential of a constant frequency, a coil which is supplied with the excitation potential for generating an electromagnetic alternating field,
calculating means for detecting an impedance change in the coil, which has been caused by an object, by determining at least one pair of values from a peak value of a sinusoidal coil current flowing through the coil and a phase shift between the coil current and the excitation potential, and means for determining a material of the object by comparing the at least one pair of values from a peak value and a phase shift of the sinusoidal coil current with reference values, wherein a window comparator has a constant, adjustable, window width which is supplied with the coil current and, respectively, a voltage signal proportional thereto, time recording means for measuring the length of time which the coil current needs in order to pass through the comparator window ($\Delta i$), with the calculating means being designed for calculating the gradient of the current profile from the length of time and the window width of the window comparator at at least one predetermined measuring phase angle as well as for calculating the peak value from the gradient of the sinusoidal coil current and its known frequency.

13. The device according to claim 12, wherein a current/voltage transformer, for converting the coil current into a proportional voltage signal.

14. The device according to claim 12, wherein the coil is connected with a capacitance into an oscillating circuit.

15. The device according to claim 12, wherein the values of the inlet point and the outlet point of the window of the window comparator are arranged symmetrically to a signal center line, in particular zero line, of the coil current.

16. The device according to claim 12, wherein a comparator for detecting a zero crossing of the excitation potential.

17. The device according to claim 12, wherein the time recording means are designed as digital counters with a constant counting frequency.

18. The device according to claim 17, wherein the output signal of a zero-crossing comparator starts the counters and the window comparator stops a counter when the coil current enters into the comparator window and stops a further counter when the coil current leaves the comparator window.

19. The device according to claim 18, wherein, from the difference of the two counts, the length of time is derived which the coil current needs in order to pass through the comparator window.

20. The device according to claim 18, wherein the calculating means are designed for using the counted measurand of the second counter as an index of a reference value table and for reading out, for each index value, a reference threshold value associated therewith and for comparing it to the counted measurand of the first counter and for inferring the material of the object from exceeding or falling below the reference threshold value used in each case.

21. The device according to claim 17, wherein the window comparator starts a counter when the coil current enters into the comparator window and stops the counter when the coil current leaves the comparator window.

22. The device according to claim 12, wherein the calculating means are designed for comparing at least one peak value determined in a discrete measuring phase to corresponding peak values of reference samples for determining the material of the object.

23. The device according to claim 12, wherein the excitation potential is adjusted to a value ranging between 1 kHz and 1 MHz, between 5 and 100 kHz and between 10 and 50 kHz.

24. The device according to claim 12, wherein a measuring cycle is performed in each period of the excitation potential.

25. A sorting plant comprising a conveying means on which a material stream is movable at a constant speed v in which objects are contained which are supposed to be identified based on their conductivity and/or ferromagnetic properties and sorted out by means of an object discharging unit, at least one device for differentiating objects influencing an electromagnetic alternating field, having a voltage source for generating a sinusoidal excitation potential of a constant frequency, a coil which is supplied with the excitation potential for generating an electromagnetic alternating field, calculating means for detecting an impedance change in the coil, which has been caused by an object, by determining at least one pair of values from a peak value of a sinusoidal coil current flowing through the coil and a phase shift between the coil current and the excitation potential, and means for determining the material of the object by comparing the at least one pair of values from a peak value and a phase shift of the sinusoidal coil current with reference values, having a window comparator having a constant, adjustable, window width which is supplied with the coil current and, respectively, a voltage signal proportional thereto, time recording means for measuring the length of time which the coil current needs in order to pass through the comparator window, with the calculating means being designed for calculating the gradient of the current profile from the length of time and the window width of the window comparator at at least one predetermined measuring phase angle as well as for calculating a peak value from the gradient of the sinusoidal coil current and its known frequency, wherein the coil is arranged close to the conveying means so that objects moving in the conveying direction of the material stream will cause a material characteristic impedance change in the coil, which is detected by the device, with the device activating the object discharging unit.

* * * * *